United States Patent
Ater et al.

[11] Patent Number: 6,151,213
[45] Date of Patent: Nov. 21, 2000

[54] VENTILATION AND COOLING CONTROL SYSTEM FOR MODULAR PLATFORMS

[75] Inventors: Dan Ater, Moshav Avigdor; Eli Avitan, Ra'anana, both of Israel

[73] Assignee: 3Com Corporation, Santa Clara, Calif.

[21] Appl. No.: 09/310,868

[22] Filed: May 12, 1999

[51] Int. Cl.[7] .................................................. H05K 7/20
[52] U.S. Cl. .................. 361/695; 361/690; 361/694; 361/741; 361/752; 361/756; 312/223.2; 454/184; 211/41.17; 174/16.1
[58] Field of Search .......................... 361/678, 690–695, 361/721, 741, 752, 756; 174/16.1; 165/80.3; 312/223.2; 211/41.17; 454/184

[56] References Cited

U.S. PATENT DOCUMENTS

| | | | |
|---|---|---|---|
| 4,502,099 | 2/1985 | Manes et al. | 361/691 |
| 4,672,509 | 6/1987 | Speraw | 361/687 |
| 4,902,238 | 2/1990 | Schindler . | |
| 5,101,320 | 3/1992 | Bhargava et al. | 361/694 |
| 5,416,427 | 5/1995 | Tracewell | 324/754 |
| 5,914,858 | 6/1999 | McKeen et al. | 361/695 |
| 6,047,836 | 4/2000 | Miles | 361/690 |

FOREIGN PATENT DOCUMENTS 0735810  10/1996  European Pat. Off.  .........  H05K 7/14

*Primary Examiner*—Leo P. Picard
*Assistant Examiner*—Boris L. Chervinsky
*Attorney, Agent, or Firm*—Howard Zaretsky; David J. Weitz; Wilson Sonsini Goodrich & Rosati

[57] ABSTRACT

A platform for holding a plurality of modules or printed circuit boards wherein the platform or chassis contains shutters placed over airflow openings in the platform. The shutters are normally closed and are opened by the act of inserting a module into the platform. The shutters are in the closed position in all slots not occupied by a module and are in the open state in all slots populated by a module. The shutters open as the module is inserted and close when the module is removed. The closed shutters prevent airflow from passing through the unpopulated slots and empty space within the platform, thus forcing the airflow to pass through the space in which the modules are present. The platform also comprises a means of controlling the number of fans that are operational in accordance with the number of modules installed in the platform. The fans closest to the modules inserted into the platform are operational while fans close to unpopulated slots are turned off. A switch or electrical contacts in the rear of the modules can be used to control the operation of the fans. In an alternative embodiment, the lower and/or the upper portion of the chassis comprises one or more one time twist off tabs for each slot that extend from the front to the rear of the platform. The twist off tabs for a slot are left intact for a slot not to be populated with modules. The tabs are removed for slots to be populated with a module.

10 Claims, 7 Drawing Sheets

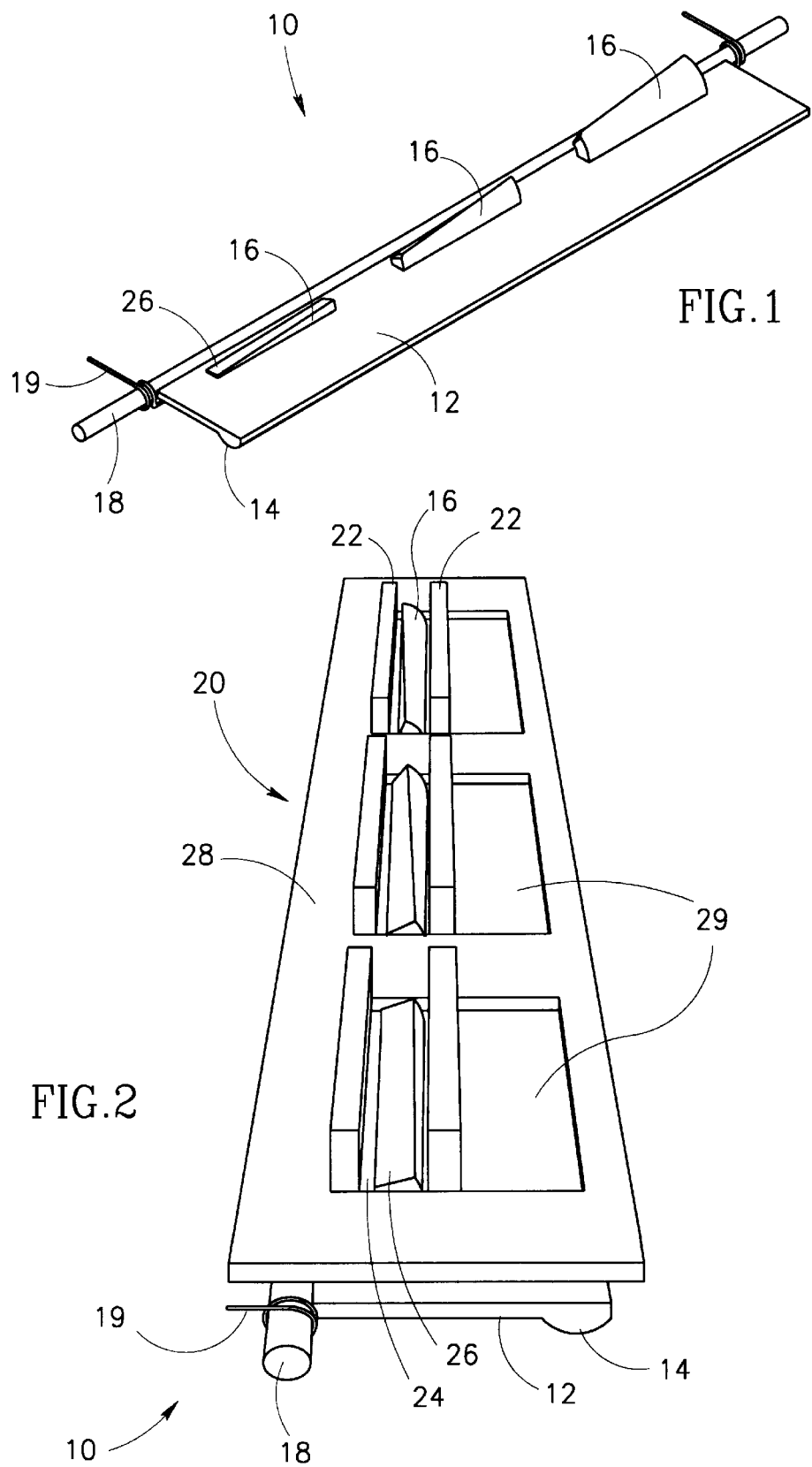

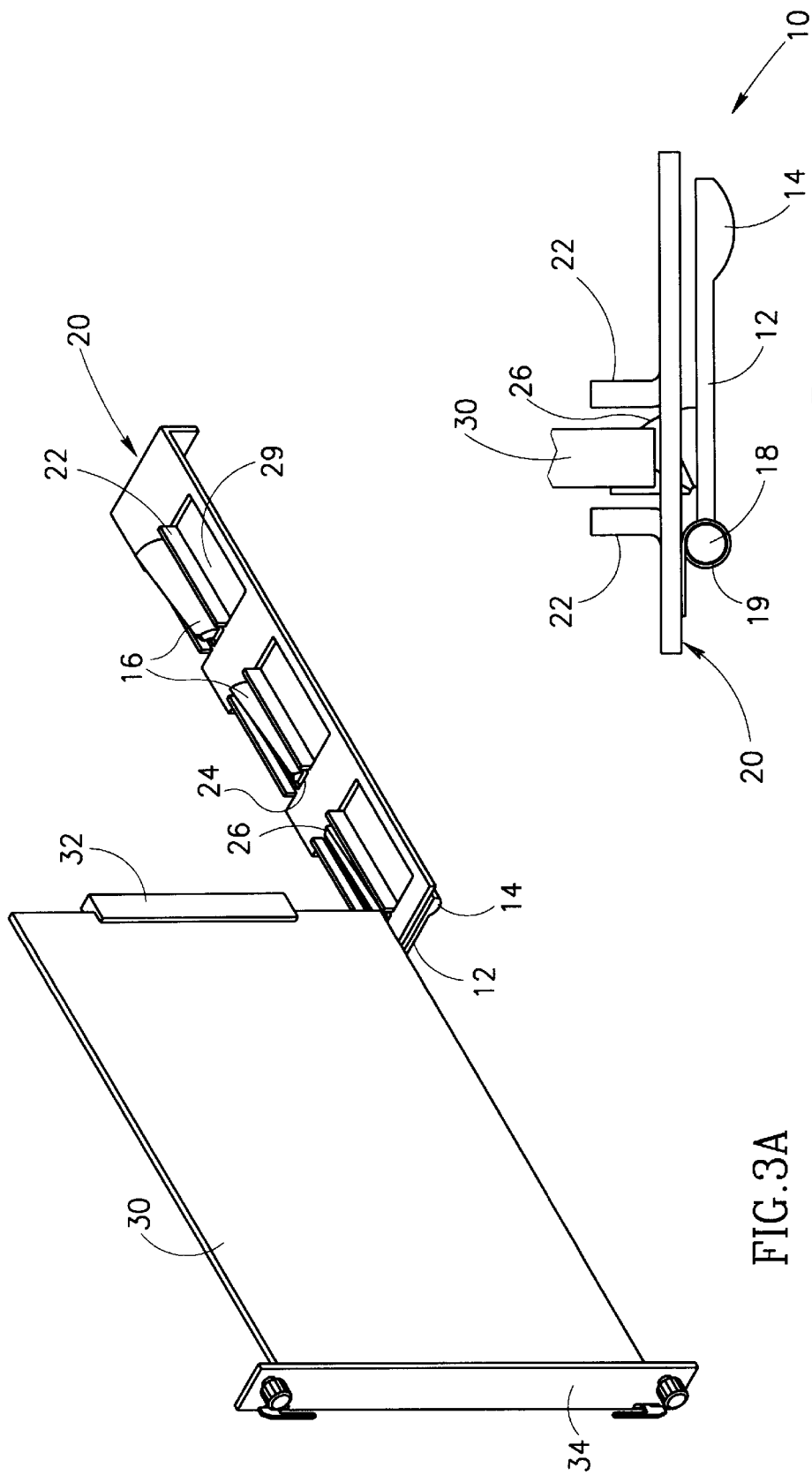

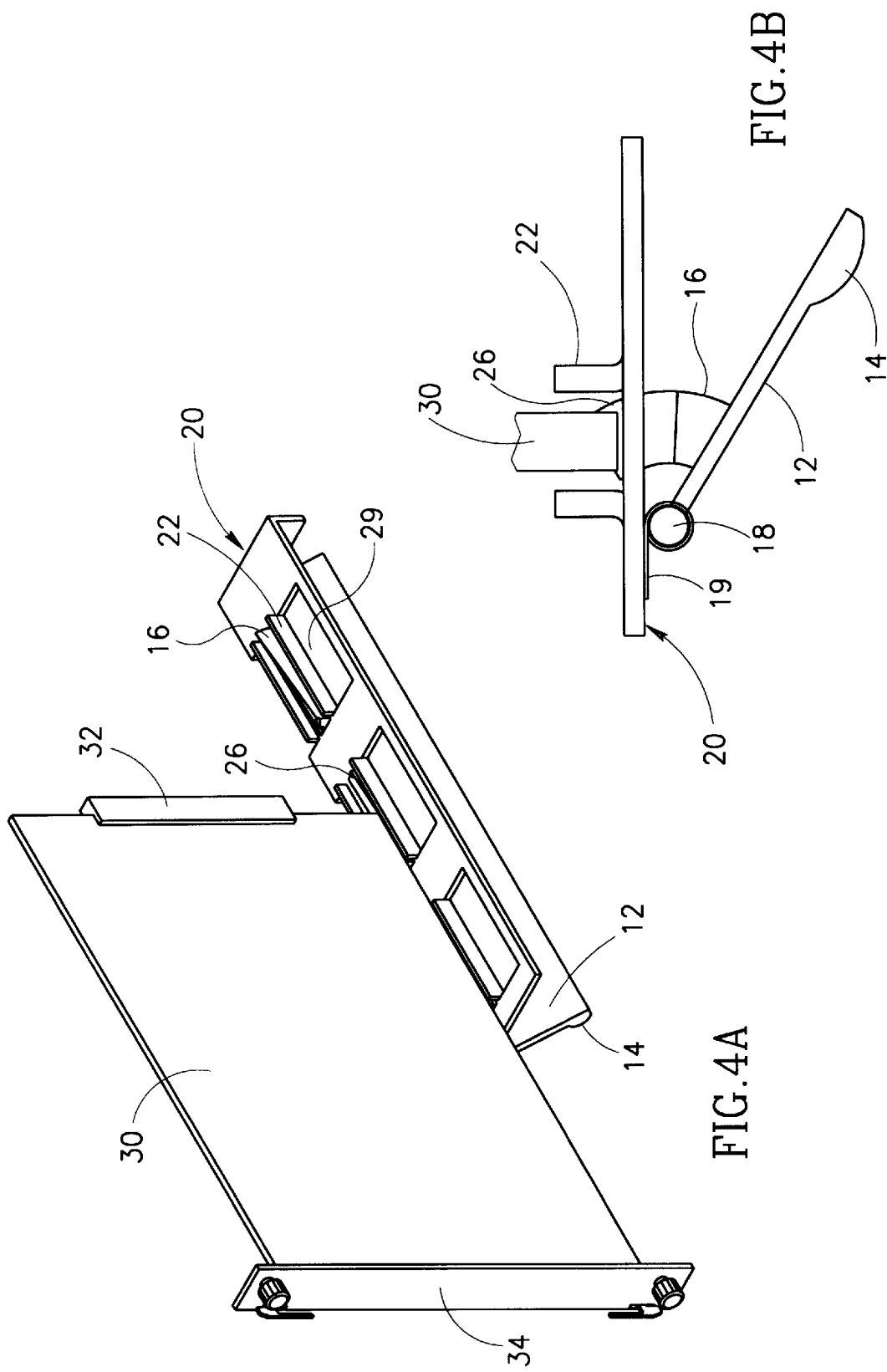

VENTILATION AND COOLING CONTROL SYSTEM FOR MODULAR PLATFORMS

FIELD OF THE INVENTION

The present invention relates generally to modular platform design and more particularly relates to a system for controlling the ventilation and cooling within a modular platform such as a card cage.

BACKGROUND OF THE INVENTION

It is and has been common practice in the engineering field to construct large electronic systems from a plurality of printed circuit (PC) boards or PCBs that are arranged and installed in one or more card cages or chassis. The card cages are typically constructed from metal or some other sturdy material and serve to mechanically support the multitude of electrical PC boards making up the apparatus. Each card in the cage plugs into a backplane which may be either passive or active.

The card cages typically contain a variable number of PC boards or cards, i.e., electronic and electrical modules, generally referenced modules. The card cages are designed to provide a plurality of functions to the modules contained therein. As stated above, the major function provided is mechanical support for all the cards to be placed in the cage. Also, the cage serves to provide a mounting means for the backplane which ties all the cards together. The cage also provides means for the mounting of the power supply which may consist of more than one unit. In addition, the cage provides the means for management of configuration and functional parameters support. The cage further supports any other service or functional support required by the PCBs enclosed therein. Card cages or boxes that provide one or more services to the PC boards are also termed platforms, as used in the description hereinbelow.

In the typical scenario, platforms for a multiple number of modules normally generate large quantities of heat that must be removed. The most common method for the removal of this heat is forced air ventilation by means of one or more electrical fans. The use of forced air ventilation has, however, a number of disadvantages and drawbacks that must be considered when the removal of heat is accomplished by simply installing fans in the platform.

First, the number of modules installed in the platform may vary between a minimum of none to the maximum number available in the given particular platform. The air flow path can change in accordance with the number of modules installed in the platform. In many cases, the air flow path can change in such a way that one or more modules present in the platform receive a minimal of cooling while most of the air flow passes unused through the spaces or slots unoccupied by modules. In such cases, the designers of the platforms usually increase the airflow by a significant amount in order to provide sufficient cooling to make the worst case scenario of possible combinations of present and absent modules still acceptable.

This prior art approach suffers from several disadvantages as described below. First, increasing the airflow requires additional fans and each fan must have increased capacity. It is not guaranteed, however, that each platform will have sufficient room to accommodate the larger number of fans required by this approach.

Second, the increased number of fans generates additional noise. In most countries, platforms are required to comply with government regulations and/or standards limiting noise production. The use of powerful fans, in large numbers, makes compliance with statutory or standards based noise limitations more difficult if not practically impossible.

Third, high capacity fans typically operate under increased stress. It is thus highly probable that these larger capacity fans will have lower Mean Time Between Failure (MTBF) ratings.

Fourth, additional fans, especially higher airflow capacity fans, require significant additional power from the electrical power plant in the platform.

An illustrative example of this problem will now be presented. Take, for example, a 16 slot card chassis that can host as few as a single module or as many as 16 modules. In cases when most of the space inside the chassis is not occupied by modules, the airflow may pass through the free space leaving a single module almost or completely without cooling airflow. In particular, consider a platform, i.e., chassis, with eight modules placed on one side of the platform. In such an arrangement, the airflow is severely reduced within the area populated by modules, which is the area in need of cooling. Most of the airflow takes the path of least resistance, which is the unpopulated portion of the platform. In order to provide sufficient cooling to the modules, the designer of the platform of this example, must place six fans, each providing 50 cfm. In the case when all 16 modules are inserted in the platform, only 30 cfm per fan is sufficient to provide adequate cooling.

Thus, there is a strong felt need for a platform (card chassis) that consumes less power, generates less noise, does not lower the MTBF of the fans installed therein and which is able to supply cooling airflow to the modules (PCBs) that are installed therein regardless of the number of modules installed and their position in the platform.

SUMMARY OF THE INVENTION

The present invention is a platform for holding a plurality of modules or printed circuit boards (PCBs) wherein the platform or chassis contains shutters that are placed over airflow openings in the platform. These shutters are normally closed and are opened by the act of inserting a module into the platform. Thus, the shutters are in the closed position in all slots unoccupied by a module and are in the open state in all slots populated by a module. The shutters are operated mechanically by the act of inserting the modules into the platform chassis. The shutters open as the module is inserted and close when the module is removed. The shutters that are closed function to prevent airflow from passing through the unoccupied slots and empty space within the platform, thus forcing the airflow to pass through the space in which the modules are present. This serves to greatly improve the cooling efficiency of the platform for any given fan capacity.

In addition, the platform of the present invention comprises a means of controlling the number of fans that are operational in accordance with the number of modules installed in the platform. The fans closest to the modules inserted into the platform shall be operational. Conversely, fans close to unpopulated slots shall be turned off. A switch or electrical contacts in the rear of the modules can be used to control the operation of the fans. Controlling the operation of the fans in accordance with the position and number of installed modules serves to improve the availability of the cooling system due to the fact that inactive fans lengthen the effective MTBF rating of the fans.

In an alternative embodiment, the lower and/or the upper portion of the chassis comprises one or more one time twist off tabs for each slot that extend from the front to the rear of the platform. These twist off tabs are left intact for slots not to be populated with modules. The tabs are removed for slots to be populated with a module. When removed, the spaced created forms the airflow openings permitting cooling air to flow over the module.

BRIEF DESCRIPTION OF THE DRAWINGS

The invention is herein described, by way of example only, with reference to the accompanying drawings, wherein:

FIG. 1 is a perspective view illustration of the shutter of the present invention having a plurality of cams positioned thereon;

FIG. 2 is a perspective view illustration of the shutter of the present invention installed in a platform and which is in the closed position;

FIG. 3A is a perspective view illustration of a portion of a platform with the shutter of the present invention installed therein in the closed position and having a PC board not yet inserted;

FIG. 3B is a side view illustration of the shutter in the closed position corresponding to FIG. 3A;

FIG. 4A is a perspective view illustration of a portion of a platform with the shutter of the present invention installed therein and with the PC board inserted half way;

FIG. 4B is a side view illustration of the shutter in the half open position corresponding to FIG. 4A;

DETAILED DESCRIPTION OF THE INVENTION

Figure 5B:
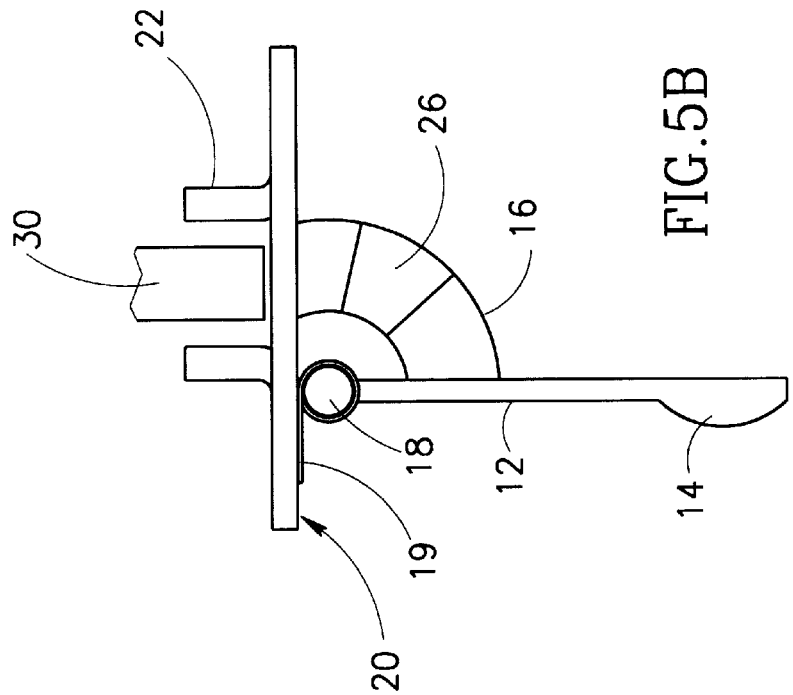
FIG. 5B is a side view illustration of the shutter in the completely open position corresponding to FIG. 5A.

A perspective view illustration of the shutter of the present invention having a plurality of cams positioned thereon is shown in FIG. 1. The shutter, generally referenced 10, is constructed so as to close off the airflow gaps between the rails of a platform, e.g., chassis or card cage. The shutter 10 is opened by the insertion of a module, i.e., PCB or circuit card, and is closed by the removal of the module via the action of spring 19. The spring 19 is positioned so to open and close the shutter with the insertion and removal of a module.

The shutter 10 comprises an elongated substantially flat rigid member 12 with a plurality of cams 16 fixed on its upper surface. The shutter 10 can be manufactured from any suitable material such as metal or plastic. Depending on the material used, elongated rib 14 may or may not be necessary for increasing the strength of the shutter 10. A pivot, i.e., pin, 18 on either side of the shutter is normally seated in holes provided on the front and rear portion of the platform. The spring 19 is also affixed to the platform so as to maintain the shutter in the closed position when a slot is unoccupied.

The plurality of cams 16 have an extended rotation ramp 26 having a helical shape. The ramp begins at near zero incline at the front of the shutter and extends, preferably in a continuous manner, in counterclockwise fashion to substantially the 90 degree point at the rear of the shutter.

A perspective view illustration of the shutter of the present invention installed in a platform and which is in the closed position is shown in FIG. 2. Only a portion of the platform (card cage chassis) 20 is shown for clarity sake. The shutter 10 is shown in the closed position under airflow openings 29. Rail guides 22 are affixed to the surface 28 of the card cage and positioned on either side of the path of the module.

The shutter 10 is pivotably connected to the front and rear of the platform 20 via front and rear pivot pins 18. The shutter is mounted in the platform such that the plurality of cams 16 fit within the rails guides 22 and protrude through the openings 24. The cams must protrude through the openings sufficiently to make direct contact with the lower edge of a module as it is inserted into the slot in the platform.

In accordance with the present invention, when the module is first inserted, it makes contact with the surface 26 of the cam 16 closest to the front of the platform. Upon further insertion of the module, the force exerted on the cam pushes the shutter downward as it thus begins to open. As the module is inserted further into the platform, the action of the cams 16 increases and the shutter 10 is opened further and further. Since the shape of the cams is a helix, the shutter rotates downward into the open position. Eventually, when the module is fully inserted into the platform, the shutter is in its fully open position. At this point, the edge of the module is contacting the rear portion of the last cam 16, which has the highest cam action. When the shutter is fully open, air can flow freely through the bottom airflow openings 29 across the module and out through complementary airflow openings in the upper portion of the platform. Conversely, when the module is removed, the elastic tension stored in the spring 19 rotates the shutter into the closed position.

A perspective view illustration of a portion of a platform with the shutter of the present invention installed therein in the closed position and having a PC board not yet inserted is shown in FIG. 3A. The module 30 is shown positioned at the beginning of its travel into the slot in the platform 20. The module 30 comprises a back connector 32 and a front panel 34. The closed shutter seals the airflow openings 29. Shown also are the plurality of cams 16 and their surfaces 26 and slot openings 24.

A side view illustration of the shutter in the closed position corresponding to FIG. 3A is shown in FIG. 3B. In the closed position, the shutter 10 substantially seals the openings 29 in the platform 20. Cams 16 and associated surfaces 26 appear as a ramped surface that progresses from the front of the platform to the rear. The pivot 18 is affixed to a receiving hole in the platform 20.

A perspective view illustration of a portion of a platform with the shutter of the present invention installed therein and with the PC board inserted half way is shown in FIG. 4A. The module 30 is shown positioned at the midpoint of its travel into the slot in the platform 20. The airflow openings 29 in the platform 20 are partially open at this point permitting less than a maximum flow of air. Shown also are the plurality of cams 16 and their surfaces 26 and slot openings 24.

A side view illustration of the shutter in the half open position corresponding to FIG. 4A is shown in FIG. 4B. In the midpoint position, the shutter 10 has been rotated to an angle of approximately 45 degrees from the horizontal closed position. Cams 16 and associated surfaces 26 appear as a ramped surface that progresses from the front of the platform to the rear. The pivot 18 is affixed to a receiving hole in the platform 20.

Figure 5A:
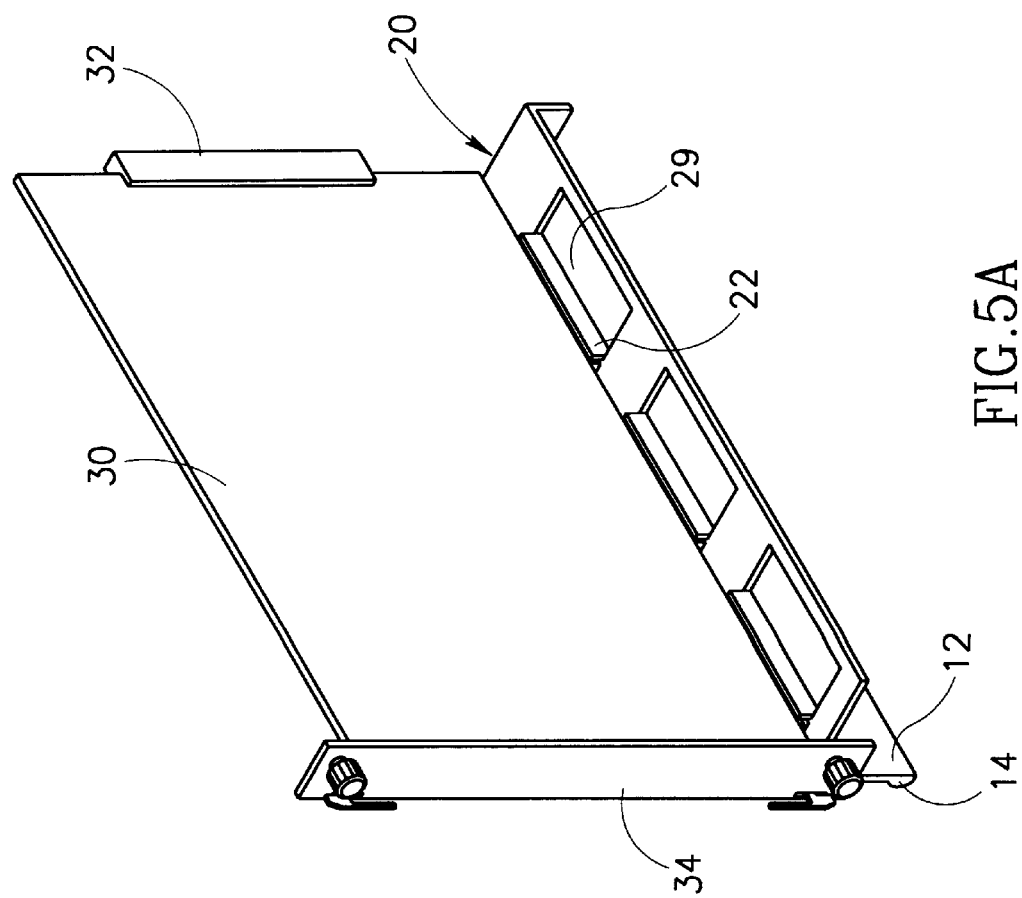
FIG. 5A is a perspective view illustration of a portion of a platform with the shutter of the present invention installed therein and having a PC board fully inserted.

A perspective view illustration of a portion of a platform with the shutter of the present invention installed therein and having a PC board fully inserted is shown in FIG. 5A. The module 30 is shown positioned at the end of its travel into the slot in the platform 20. The airflow openings 29 in the platform 20 are fully open at this point maximum airflow through them. Shown also are the plurality of cams 16 and their surfaces 26 and slot openings 24.

A side view illustration of the shutter in the completely open position corresponding to FIG. 5A is shown in FIG. 5B. In the fully open position, the shutter 10 has been rotated to an angle of approximately 90 degrees from the horizontal closed position. Cams 16 and associated surfaces 26 appear as a ramped surface that progresses from the front of the platform to the rear. The pivot 18 is affixed to a receiving hole in the platform 20.

It is important to note that the invention contemplates shutters having any number of cams. Shutters with three cams was shown for illustrative purposes only. Once skilled in the art could easily construct platforms with shutters having any number of cams. In each case, however, the surface of the cam comprises a preferably smooth rotation ramp from substantially zero angle and upwards to higher angles. The cam end point must protrude a sufficient amount so as to rotate the shutter from the completely closed position to the fully open position.

Figure 6:
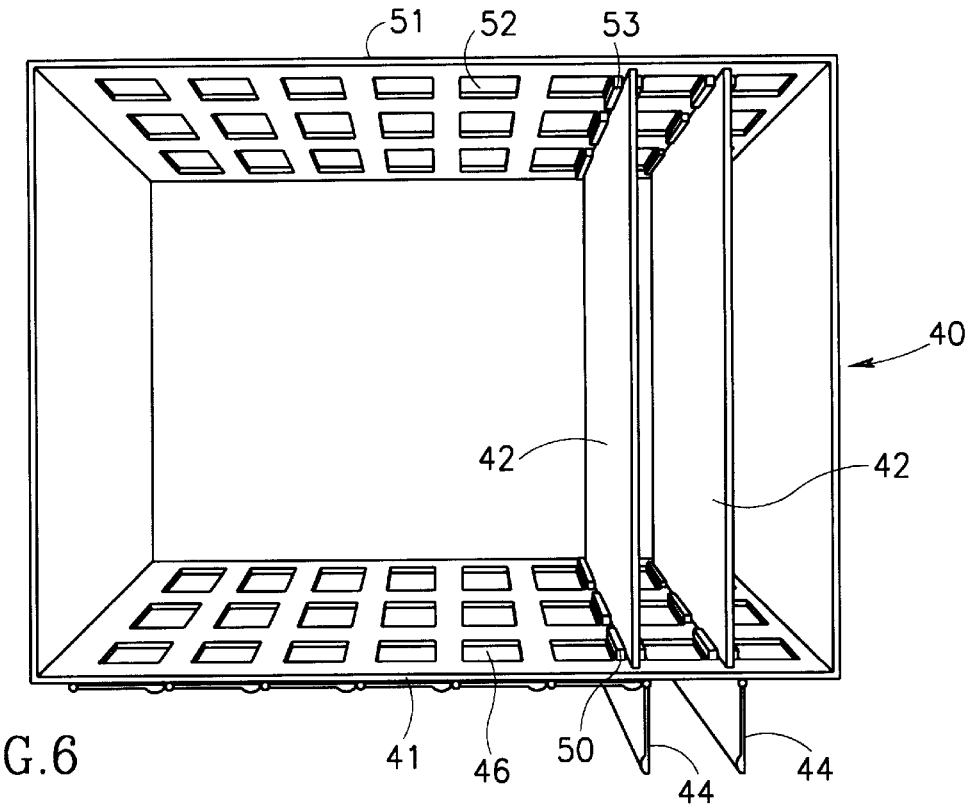
FIG. 6 is a perspective view illustration of an example platform with a plurality of modules installed therein and having shutters installed on the lower rails.

A perspective view illustration of an example platform with a plurality of modules installed therein and having shutters installed on the lower rails is shown in FIG. 6. The platform 40 is shown having a plurality of slots. Each slot has a lower portion 41 and an upper portion 51. Each slot on the lower portion comprises guide rails 50 for directing the insertion of a module. Correspondingly, each slot in the upper portion 51 comprises guide rails 53. The lower portion 41 also comprises airflow openings 46 and shutters 44 which are normally closed while its associated slots are unpopulated. Likewise, the upper portion 51 comprises airflow openings 52 which are normally always open to the flow of air.

As an example only, the platform is shown populated with two modules 42 inserted into the right most slots in the platform. Assuming the modules themselves form a seal against the lateral movement of air once inserted into the platform, no air can flow from the two rightmost openings into the empty space within the platform. While the two modules 42 are fully inserted into the slots, their respective shutters are in the fully open state permitting cooling air to flow from the openings 46 in the bottom portion of the platform, over the surface of the modules and out through the openings 52 in the upper portion of the platform. The remaining unpopulated slots remain closed by their shutters, thus preventing air from entering the empty space and bypassing the installed modules.

Figure 7:
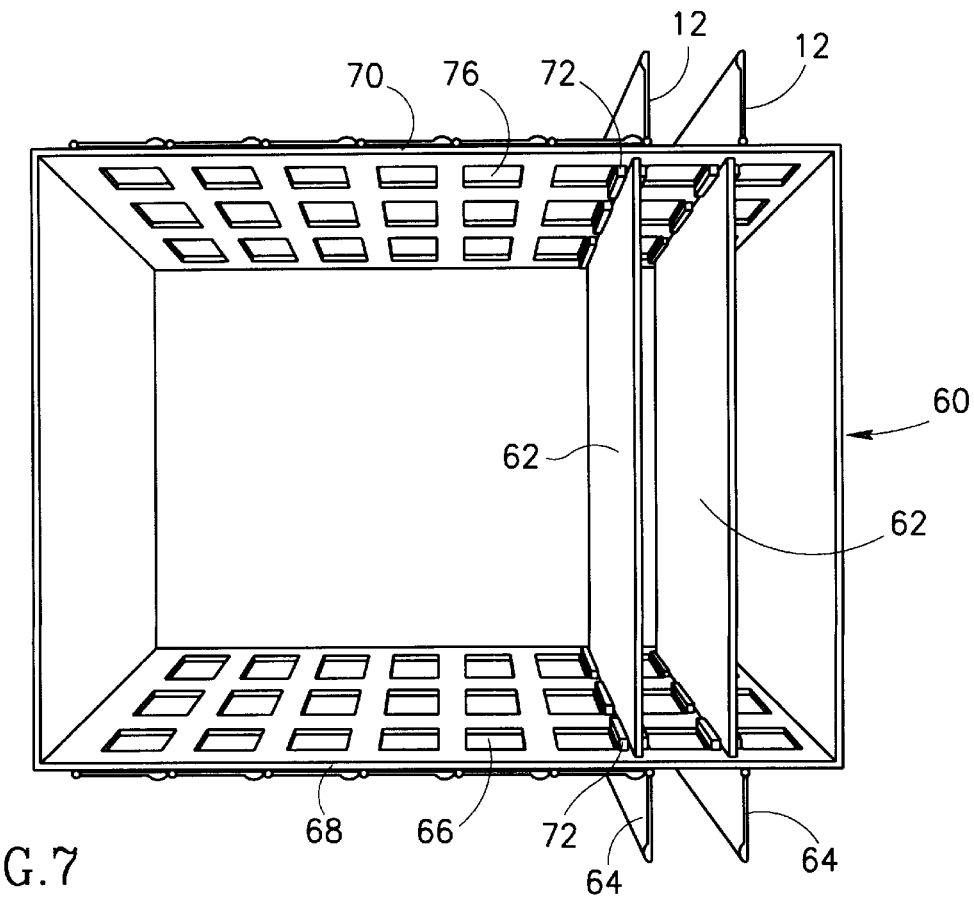
FIG. 7 is a perspective view illustration of an example platform with a plurality of modules installed therein and having shutters installed on the lower and upper rails.

A perspective view illustration of an example platform with a plurality of modules installed therein and having shutters installed on the lower and upper rails is shown in FIG. 7. The platform 60 comprises a lower portion 68 comprising airflow openings 66, guide rails 72 and shutters 64. Similarly, the upper portion 70 comprises airflow openings 76, guide rails 70 and shutters 74. Two modules 62 are shown installed in the right most two slots in the platform 60. This embodiment is similar to that of FIG. 6 with the difference being that shutters are in place on both lower and upper portions of the platform. Depending on the dimensions of the modules used and the particular application, the upper shutters may or may not be needed, assuming cooling air enters from the bottom and exits through the top. The additional set of shutters for each slot may be needed to reduce the airflow into the empty space within unpopulated slots in the platform.

Most platforms designed to hold multiple modules, are outfitted with at least one fan for providing cooling air to be directed across the module. If a module, however, is not installed in the platform, the fan does not need to operate as there is nothing to cool. Thus, to conserve electrical power and increase the life of the fan, a switch mechanism is used to operate the fan only when the module is inserted in the slot. In addition, if the shutter of a slot is closed, the necessity for the fan to operate is obviated, as no cooling air is needed.

Figure 8:
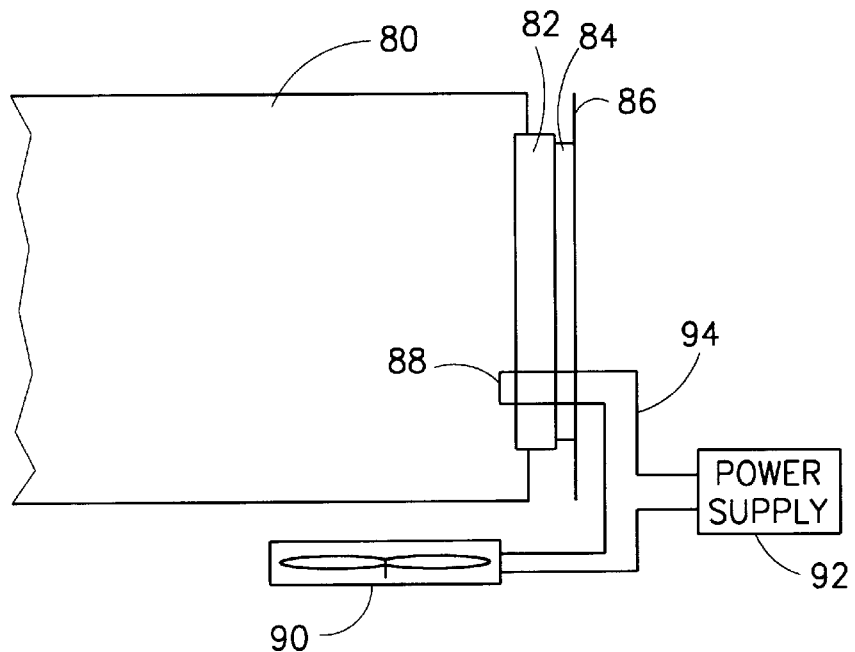
FIG. 8 is a schematic diagram illustrating the switch circuit for conditional operation of the fan for a single module.

A schematic diagram illustrating the switch circuit for conditional operation of the fan for a single module is shown in FIG. 8. The switching is performed via a loopback contact 88 connected to or within the connector 82 of the module. The wiring 94 couples the connector 84 affixed to the backplane 86 to the fan 90 and the power supply 92. Using this arrangement, the fan is operational only when the module 80 is fully inserted into the slot in the platform. In addition, as described above, the insertion of the module also opens the shutter permitting the flow of air from developed by the operation of the fan.

Figure 9:
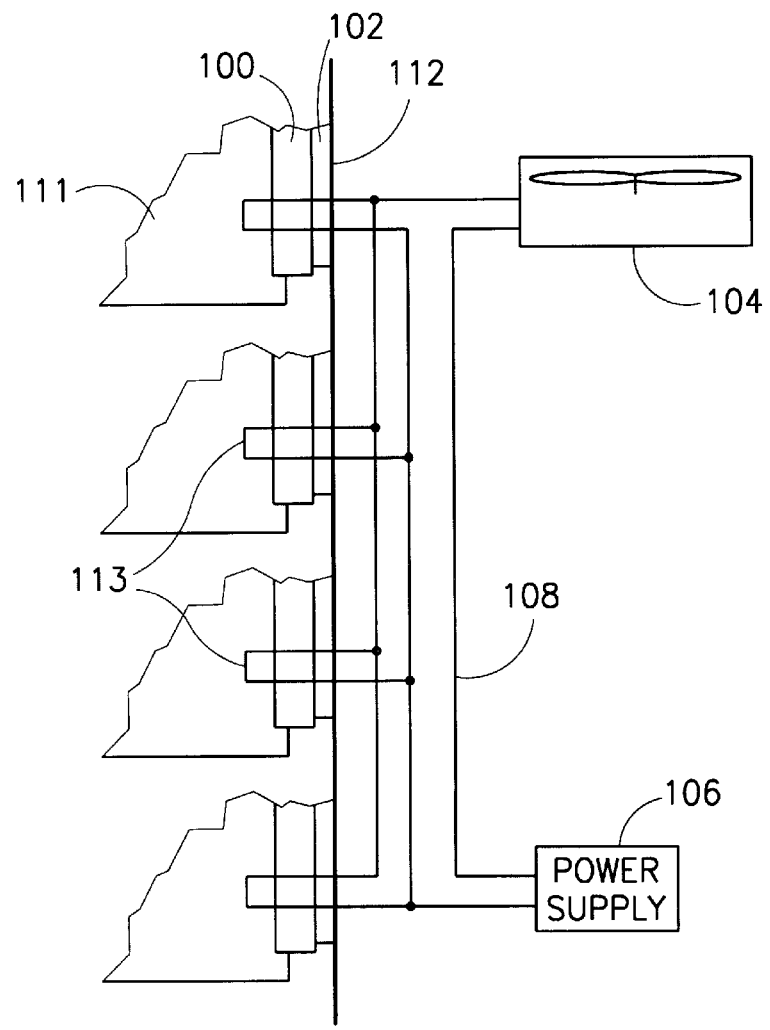
FIG. 9 is a schematic diagram illustrating the switch circuit for conditional operation of the fan for multiple modules.

A schematic diagram illustrating the switch circuit for conditional operation of the fan for multiple modules is shown in FIG. 9. In the case when a platform is constructed to hold a large number of modules, more than one fan is typically used to provide sufficient cooling airflow for all the modules. In this case, a single fan may be responsible for providing cooling airflow for a plurality of modules. In this case a group of modules located next to each other can be associated with a single fan. In any one of the modules within the group is installed, the fan is made to operate. If all slots in the group are not populated, the fan is to be turned off.

Therefore, it is provided by the present invention means for ORing the insertion of any of a group of modules to control the operation of one or more fans. In this example, the group comprises four modules assigned to a single cooling fan 104. The connector 100 of each module is shown mated with the connector 102 on the backplane 112 of the platform. Electrical power from the power supply 106 is applied to the fan 104 via wiring 108 when one or more modules are inserted into the platform. One skilled in the art can easily extend his example to groups having any number of modules and any number of fans.

Figure 10:
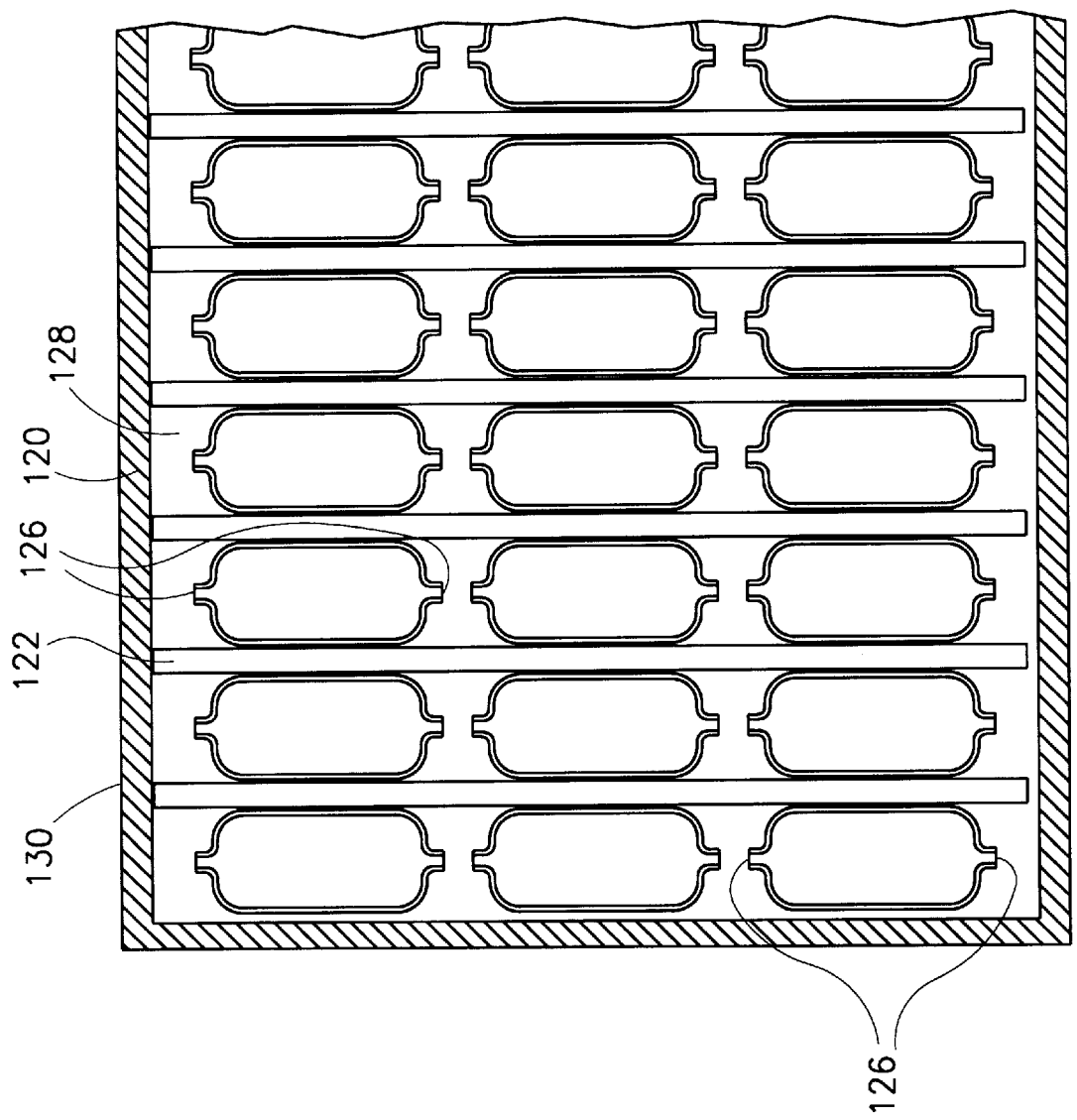
FIG. 10 is a diagram illustrating an alternative embodiment of the present invention including a one time twist off airflow shutter.

An alternative embodiment of the present invention comprises a one time twist off airflow shutter that is normally in the closed position. A diagram illustrating an alternative embodiment of the present invention including a one time twist off airflow shutter is shown in FIG. 10. The platform 130 comprises front and rear portions 120 with rigid cross members 128 connected between them. Note that although only the lower portion of the platform is shown for clarity sake, this one time twist off embodiment can be implemented on the upper portion as well.

The cross member 128 comprises a slot rail guide 122 for directing the insertion of a module. One or more airflow opening tabs 124 are cut into or stamped from the cross member 128. A thin narrow portion 126 on each tab connects the tab to the cross member.

In operation, the tabs 124 are left intact on slots that are not to be populated by modules. Thus, on these slots, the tabs 124 block any airflow. On slots that are to be populated with a module, the tabs 124 are removed by twisting repeatedly until they break off from the chassis. Once broken off, the tabs typically cannot be easily put back on. Removing the tabs from a slot permits cooling air to flow across the module inserted therein. This embodiment has utility in applications where it is not likely that modules will be removed from the platform once they are installed.

While the invention has been described with respect to a limited number of embodiments, it will be appreciated that many variations, modifications and other applications of the invention may be made.

What is claimed is:

1. A platform for housing a plurality of modules, comprising:
    a box like chassis open on one face and adapted to accept said plurality of modules, said chassis comprising a plurality of slots, a lower portion and an upper portion; and
    an electrical fan mechanism providing cooling airflow to be directed over said modules;
    wherein each slot comprises rails for guiding the insertion of one of said modules into said chassis;
    an airflow opening mechanism for allowing air to flow over and across said module inserted into said slot;
    a shutter pivotally connected to said chassis and rotatable between a closed position whereby air is prevented from flowing through said airflow opening mechanism and a fully open position wherein maximum airflow is permitted to flow through said airflow opening mechanism;
    one or more cams affixed to said shutter and operative to rotate said shutter from a closed position to an open position as a consequence of said module directly contacting said cams during the insertion of said module; and
    a spring mechanism connected to said shutter and said chassis and operative to retain said shutter in the closed position in the absence of one of said modules in said slot, said spring mechanism operative to rotate said shutter from the open position to the closed position upon the removal of one said modules from said slot.

2. The platform according to claim 1, wherein said electrical fan mechanism comprises a plurality of electrical fans.

3. The platform according to claim 1, wherein said airflow opening mechanism comprises one or more openings in said lower portion and said upper portion of said chassis so as to provide airflow across and over any modules inserted in said slots.

4. The platform according to claim 1, wherein at least a portion of said slots are positioned adjacent said lower portion of said chassis.

5. The platform according to claim 1, wherein at least a portion of said slots are positioned adjacent said upper portion of said chassis.

6. The platform according to claim 1, wherein said slots are positioned adjacent the lower and user portions of said chassis.

7. The platform according to claim 1, wherein said shutter comprises a substantially rigid elongated member extending from the front of said chassis to the rear thereof and is sufficiently wide enough to cover said airflow opening mechanism when in the closed position.

8. The platform according to claim 1, wherein at least one of the one or more cams have a helical surface.

9. The platform according to claim 1, further comprising an electrical contact mechanism which causes said fan mechanism to operate only when said module is fully inserted in said slot in said chassis.

10. The platform according to claim 1, further comprising an electrical contact mechanism which causes one or more fans adjacent a group of modules to operate only any member of said group of modules is fully inserted into said chassis.

* * * * *